United States Patent [19]

Yanai et al.

[11] 4,386,464

[45] Jun. 7, 1983

[54] METHOD AND APPARATUS FOR MOUNTING ELECTRONIC COMPONENTS IN POSITION ON CIRCUIT BOARDS

[75] Inventors: Seiji Yanai, Harunamachi; Hideo Shirouchi, Takasaki, both of Japan

[73] Assignee: Taiyo Yuden Co., Ltd., Tokyo, Japan

[21] Appl. No.: 215,518

[22] Filed: Dec. 11, 1980

[30] Foreign Application Priority Data

Dec. 28, 1979 [JP] Japan .................. 54-172517

[51] Int. Cl.³ .................. H05K 3/30; B23P 19/00
[52] U.S. Cl. ...................... 29/834; 29/739; 29/740; 29/832; 221/266
[58] Field of Search ............... 29/834, 832, 740, 739; 221/192, 93, 94, 263, 266

[56] References Cited

U.S. PATENT DOCUMENTS

| | | | |
|---|---|---|---|
| 3,859,723 | 1/1975 | Hamer et al. | 29/740 X |
| 3,907,008 | 9/1975 | Bates et al. | 140/105 |
| 3,963,456 | 6/1976 | Tsuchiya et al. | 29/739 |
| 4,127,432 | 11/1978 | Kuwawo et al. | 29/740 X |
| 4,142,286 | 3/1979 | Knuth et al. | 29/739 X |
| 4,208,005 | 6/1980 | Nate et al. | 29/834 X |
| 4,292,116 | 9/1981 | Takahashi et al. | 29/740 X |

*Primary Examiner*—Francis S. Husar
*Assistant Examiner*—Carl J. Arbes

*Attorney, Agent, or Firm*—Woodcock, Washburn, Kurtz, Mackiewicz & Norris

[57] ABSTRACT

For automatically mounting electronic components, such as tubular ceramic capacitors having no leads, in preassigned positions on a printed circuit board, there is employed a template having formed therein depressions arranged in mirror-image relationship to the arrangement of the preassigned mounting positions of the components on the circuit board. The depressions have a depth less than the diameter of each component. Removably mounted on the template is a guide plate having passages formed therethrough in register with the template depressions. The electronic components are chuted into the template depressions through the passages in the guide plate, and the positions or attitudes of the components in the template depressions are corrected by applying mechanical vibrations to the superposed template and guide plate, preferably while the latter are being tilted. Then, with the guide plate removed from over the template, a printed circuit board having an adhesive applied to selected surface regions thereof are placed over the template, thereby causing adhesion of the components to the circuit board. After separation of the circuit board from the template, the electrodes of the components are soldered to the conductive pattern on the circuit board.

12 Claims, 18 Drawing Figures

METHOD AND APPARATUS FOR MOUNTING ELECTRONIC COMPONENTS IN POSITION ON CIRCUIT BOARDS

BACKGROUND OF THE INVENTION

This invention relates to a method of, and apparatus for, simultaneously mounting a plurality of electronic components in preassigned positions on a circuit board. The invention is particularly well adaptable for the mounting of cylindrical or tubular electronic components, such as tubular ceramic capacitors without leads, on successive printed circuit boards.

U.S. Pat. No. 3,907,008, issued to Bates et al. on Sept. 23, 1975, reflects conventional practice in mounting electronic components on printed circuit boards. The conventional practice has been to insert the leads of electronic components into and through holes formed in the circuit boards and to solder the leads to the printed circuit patterns on the boards. However, if the components are of the type having a pair of leads extending in the opposite directions therefrom, such leads must be bent for insertion through the holes in the circuit boards. The mounting of the components with the bent leads in objectionable as it necessitates the use of circuit boards larger than they need to be if the components have no such bent leads, resulting in a corresponding increase in the size of the instruments incorporating such circuit boards. This runs counter to the current trend toward the minimization of electronic or electrical instruments.

Recently, therefore, there has been suggested a tubular ceramic capacitor having no leads in the conventional sense. This "leadless" capacitor includes a tubular ceramic body having an inner and an outer electrode formed, thereon. The inner electrode has a portion overlying part of the outer surface of the ceramic body. Thus, as the capacitor is placed on the surface of a circuit board having a conductive pattern printed thereon, its two electrodes can be soldered directly to the conductive pattern.

The direct connection of the electrodes to the circuit pattern makes possible the use of smaller circuit boards, to be built into smaller instruments. Because of the lack of leads, however, certain difficulties have been encountered in positioning the capacitors on, and attaching them to, printed circuit boards. The same difficulties apply, of course, to leadless resistors and other electronic components.

SUMMARY OF THE INVENTION

The present invention aims at the provision of a novel method of, and apparatus for, simultaneously mounting a plurality of leadless electronic components in position on a circuit board without the difficulties encountered heretofore. The invention makes possible the exact placement of a plurality or multiplicity of leadless electronic components on a circuit board. It also solves the problem of how to mount any required number of such components on each of successive circuit boards in a manner which is easy to automate.

Stated in brief, the invention contemplates the use of a template having formed therein a plurality of depressions for receiving electronic components, which depressions are arranged in mirror-image relationship to the relative preassigned positions on a desired circuit board where the electronic components are to be mounted. The depressions have such a depth that the electronic components received therein partly protrude therefrom. Also employed is a guide plate having formed therethrough passages corresponding to the depressions in the template.

According to the method of this invention the guide plate is first removably placed on the template, with the guide plate passages in register with the template depressions. Then the electronic components are introduced into the template depressions via the guide plate passages. After correcting the positions and/or attitudes of the electronic components in the template depressions by application of mechanical vibrations to the superposed template and guide plate, the guide plate is removed from over the template, thereby exposing the electronic components in the template depressions. Then a circuit board, having an adhesive applied to its prescribed surface portions, is placed over the template to cause adhesion thereto of the electronic components partly protruding from the template depressions. Upon separation of the circuit board and the template the electronic components are carried away from the template depressions and mounted in the preassigned positions on the circuit board. The electrodes of the components may then be soldered directly to the conductive pattern on the circuit board.

Preferably, for correcting the positions and/or attitudes of the electronic components in the template depressions, the superposed template and guide plate are vibrated while being tilted about a suitable axis, in order that the electronic components may occupy corresponding positions in the template depressions, which receive the components with some clearances. In this manner the components can subsequently be mounted in the precise preassigned positions on the circuit board.

The apparatus for carrying the inventive method into practice employs chutes for the introduction of the electronic components into the respective template depressions via the guide plate passages. Each chute is provided with a delivery control mechanism for the delivery of only one component into each template depression. The use of the chutes in combination with the delivery control mechanisms makes possible the simultaneous delivery of a large number of components into the template depressions from a conveniently located source of such components.

According to another structural feature of the invention, the template itself, or at least the surfaces forming the bottoms of the depressions therein, are made of more or less resilient material. Thus, in spite of possible fluctuations in the diameters of tubular ceramic capacitors or like components to be handled by the method or apparatus of this invention, such components when placed in the template depressions of resiliently variable depth will all adhere to the circuit board simply as the latter is pressed against them under appropriate pressure.

The above and other features and advantages of this invention will become more apparent, and the invention itself will best be understood, from a study of the following description taken in conjunction with the attached drawings.

DETAILED DESCRIPTION

General

Figure 1:
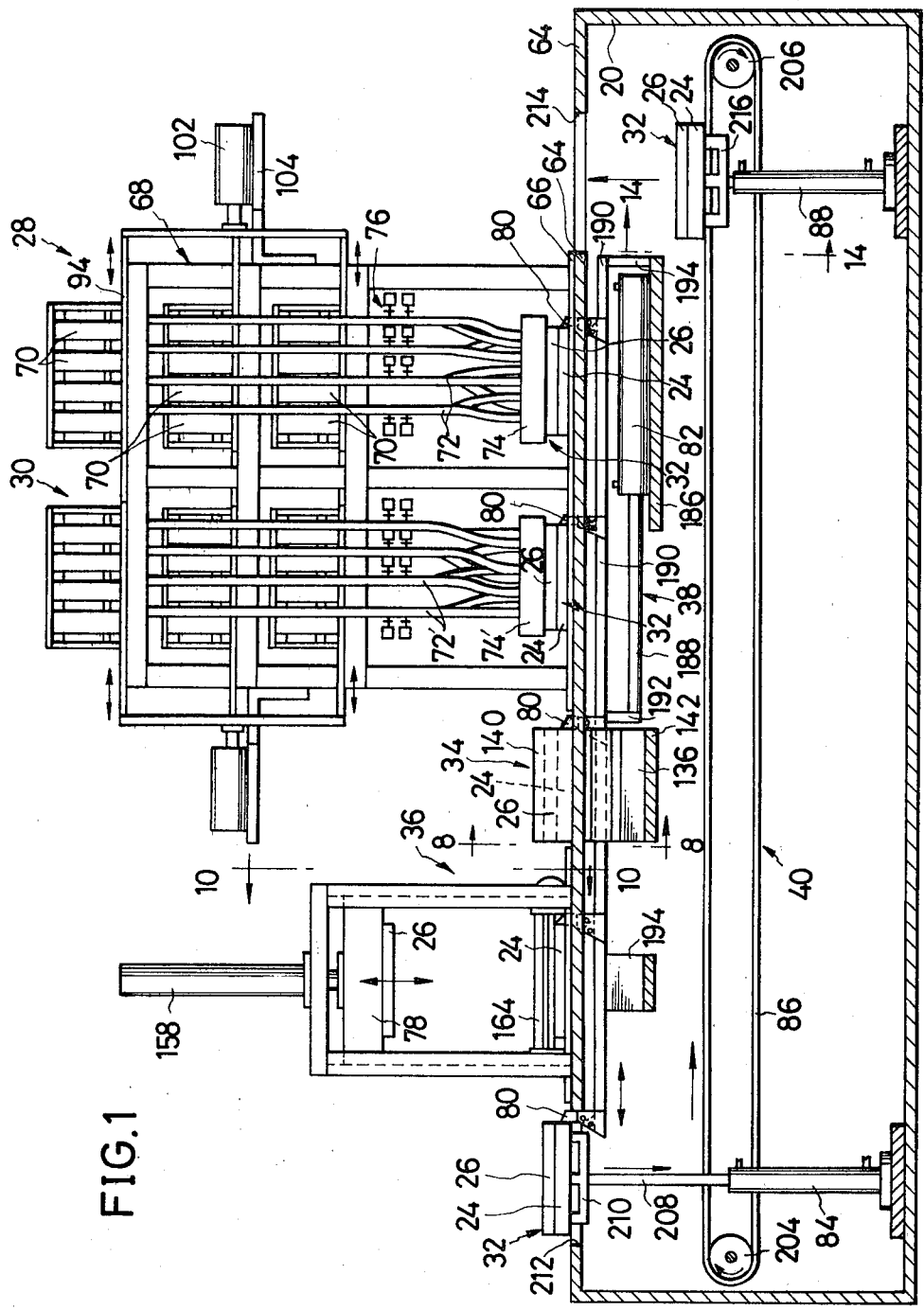
FIG. 1 is a vertical sectional view of the apparatus for mounting each prescribed number of leadless electronic components in position on successive circuit boards in accordance with the novel concepts of this invention.
Figure 2:
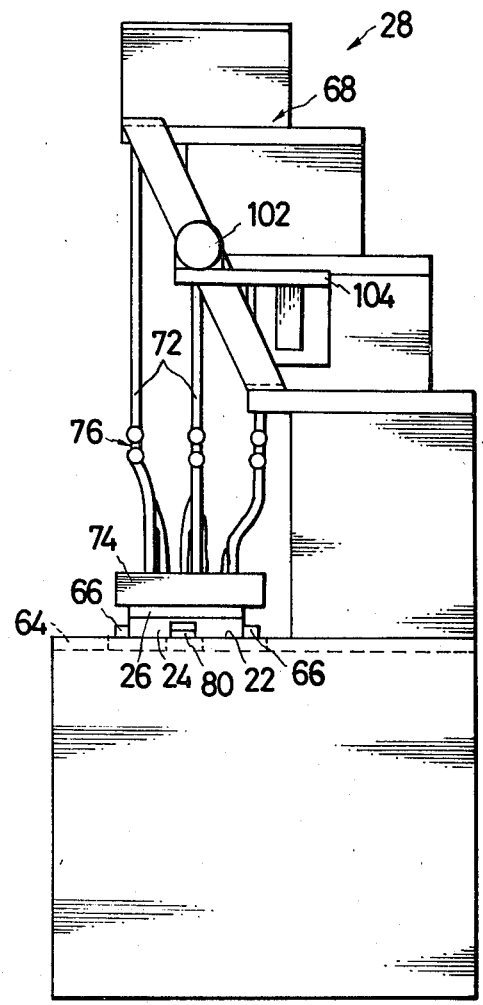
FIG. 2 is a right hand side elevational view of the apparatus of FIG. 1, with some parts being not shown to illustrate other parts more clearly.

The present invention will now be described in detail as adapted specifically for mounting leadless, tubular ceramic capacitors in preassigned positions on successive printed circuit boards. FIGS. 1 and 2 illustrate the general organization of the apparatus for use in the practice of the inventive method. The illustrated apparatus broadly comprises:

1. A generally boxlike enclosure 20 having a horizontal guide track 22 formed thereon.

2. A plurality of templates 24, each having a guide plate 26 removably mounted thereon, slidable along the guide track 22. 3. A first 28 and a second 30 supply mechanism disposed on or over the guide track 22 for supplying a prescribed number of electronic components (tubular ceramic capacitors in this particular embodiment) into each combination of superposed template 24 and guide plate 26 (hereinafter referred to as the template/guide combination and generally designated 32).

4. A positioning mechanism 34 also disposed on the guide track 22, in a position just downstream of the second supply mechanism 30, for readjusting the attitudes or positions of the capacitors within each template/guide combination 32 both by applying mechanical vibrations thereto and by tilting same.

5. A transfer mechanism 36 also disposed on the guide track 22, in a position immediately downstream of the positioning mechanism 34, for temporarily removing the guide plate 26 from over each template 24 and for transferring the capacitors from the template onto a printed circuit board (not seen in FIGS. 1 and 2).

6. A feed mechanism 38 for feeding the successive template/guide combination 32 along the guide track 22, indexing them to the first 28 and second 30 supply mechanisms, positioning mechanism 34, and transfer mechanism 36.

7. A return mechanism 40 for returning the unloaded template/guide combinations 32 from the transfer mechanism 36 to the first supply mechanism 28 through the interior of the enclosure 20.

Figure 3:
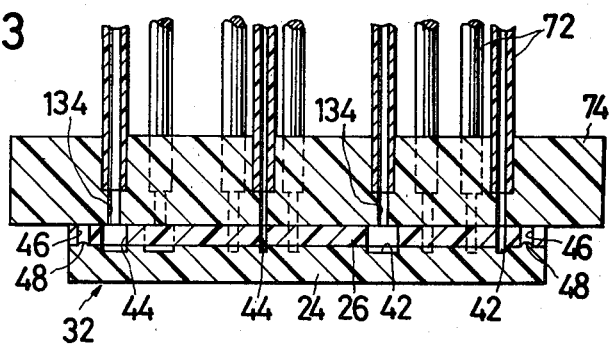
FIG. 3 is an enlarged, vertical sectional view of one of the template/guide combinations, shown together with one of the chute retainer plates and the associated chutes, in the apparatus of FIG. 1.

FIG. 3 shows in detail one of the template/guide combinations 32, in a position ready to receive the capacitors from either of the first 28 and second 30 supply mechanisms. The template 24 has formed therein a plurality of depressions 42 for receiving and holding the capacitors prior to their mounting on a printed circuit board. The placement of these depressions 42 is a reversal of, or in mirror-image relationship to, the arrangement of the preassigned positions on the printed circuit board where the capacitors are to be mounted.

Removably mounted on the template 24, the guide plate 26 has a plurality of passages 44 formed therethrough in precise register with the depressions 42 in the template. The capacitors are to be chuted into the template depressions 42 via the guide plate passages 44 by the two supply mechanisms 28 and 30. In order to be placed in position on the template 24 the guide plate 26 has a plurality of holes 46 for receiving the positioning bosses 48 formed on the top surface of the template.

Figure 4:
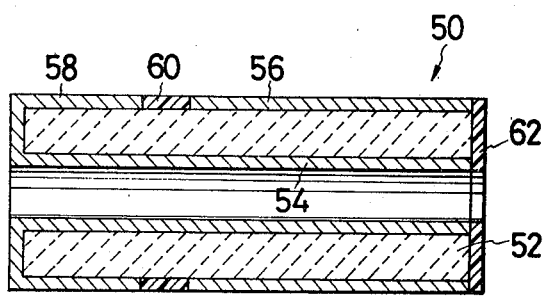
FIG. 4 is an enlarged, axial sectional view of a leadless, tubular ceramic capacitor to be handled by the apparatus of FIG. 1, the capacitor itself having been known in the art.

FIG. 4 is an axial sectional view of each tubular ceramic capacitor 50 to be handled in this particular embodiment of the invention. The capacitor 50 comprises a tubular, dielectric ceramic body 52, an inner electrode 54 covering the inside surface of the ceramic body, and an outer electrode 56 covering part of the outside surface of the ceramic body. It should be noted that the inner electrode 54 has a portion 58 overlying part of the outside surface of the ceramic body 52. The outer electrode 56 and the inner electrode portion 58 are to be soldered directly to the conductive pattern on a printed circuit board, thereby dispensing with the conventional leads. Insulating regions 60 and 62 electrically insulate the inner 54 and outer 56 electrodes from each other.

It must be pointed out at this juncture that the depth of each depression 42 in the template 24 shown in detail in FIG. 3 is less than the diameter of each capacitor 50. Thus, when the capacitors 50 are placed recumbently in the template depressions 42, the capacitors partly protrude upwardly therefrom. Such partial protrusion of the capacitors from the template depressions is essential for attachment of the capacitors to each printed circuit board, as will become better understood as the description proceeds.

With reference back to FIGS. 1 and 2 the template/guide combinations 32 travel along the guide track 22 formed on the top wall 64 of the enclosure 20 by a pair of parallel spaced guide rails 66. The use of the several template/guide combinations 32, as shown, is recommended because they expedite the mounting of the capacitors on successive printed circuit boards. It is of course understood that the illustrated apparatus operates only if there is one template/guide combination 32.

The first 28 and second 30 supply mechanisms share a three-shelved rack 68 erected on the enclosure 20, with each shelf overhanging the one therebelow. The first supply mechanism 28 uses the right hand half, as viewed in FIG. 1, of the rack 68, and the second supply mechanism 30 uses ite left hand half. Since both supply mechanisms are essentially identical in construction, only the first 28 will be described, and the parts of the second 30 will be identified simply by priming the reference numerals used to denote the corresponding parts of the first.

Each shelf of the rack portion for the first supply mechanism 28 has slidably mounted thereon a plurality of, four in the illustrated embodiment, what are herein termed parts cassettes 70. Each parts cassette houses a multiplicity of capacitors. Extending downwardly from the front edge of each shelf are four tubular chutes 72 for the delivery of the capacitors from the parts cassettes 70 into the successive template/guide combinations 32. A chute retainer plate 74 immovably holds the lower extremities of the chutes 72 in positions of registry with the passages 44 in each guide plate 26. Each chute 72 is provided with a delivery control mechanism 76 for causing the chute to supply only one capacitor into the corresponding one of the template depressions 42 of each template/guide combination 32.

Thus, in this particular embodiment, the first supply mechanism 28 delivers twelve capacitors into each template/guide combination 32. The second supply mechanism 30 delivers another twelve capacitors into the template/guide combination. The total number of capacitors to be thus supplied into each template/guide combination, and hence to be mounted on each printed circuit board, is of course subject to change depending upon the circuit design of the circuit board. It is therefore apparent that the apparatus requires only one supply mechanism if a relatively small number (not more than twelve in this case) of capacitors are to be attached to each printed circuit board.

After receiving twelve capacitors from the first supply mechanism 28, and another twelve capacitors from the second supply mechanism 30, each template/guide combination 32 enters a positioning mechanism 34. This positioning mechanism comprises a vibrator and a tilting device, as will be detailed subsequently, for correcting the attitudes and/or positions of the capacitors in the template/guide combination. Chuted into the template/guide combination, some of the capacitors may stand endwise or edgewise therein. The vibrating and tilting of the template/guide combination is effective to cause such capacitors to fall into a recumbent disposition, and further to readjust the positions of all the capacitors in the template depressions 42.

Each template/guide combination 32 is fed from the positioning mechanism 34 into the transfer mechanism 36. Included in this transfer mechanism is a lifting electromagnet assembly 78 for temporarily removing the guide plate 26 from over the template 24 to expose the capacitors received in the template depressions 42. While the guide plate 26 is separated from the template 24, a printed circuit board having an adhesive applied to selected surface portions thereof is placed over the template thereby causing adhesion of the capacitors to the circuit board. The circuit board is then separated from over the template 24, together with the capacitors adhering thereto.

Subsequently removed from the illustrated apparatus, the printed circuit board complete with the capacitors mounted in preassigned positions thereon is then preferably introduced into a drying furnace, not shown, to dry and harden the adhesive and hence to ensure firm adhesion of the capacitors thereto. Thereafter the printed circuit board is exposed to a jet of molten solder or dipped in a molten solder bath for soldering the electrodes of the capacitors to the printed conductive pattern on the circuit board.

The feed mechanism 38 comprises a plurality of, five in this embodiment, feed pawls 80 reciprocated in the longitudinal direction of the guide track 22 by a fluid-actuated cylinder 82 (hereinafter referred to as the feed cylinder). During their leftward (as viewed in FIG. 1) or forward stroke the feed pawls 80 make positive engagement with the respective templates 24 to feed the template/guide combinations 32 forwardly along the guide track 22. During their backward stroke the feed pawls 80 are pivotable, upon contact with the templates 24, in a counterclockwise direction against the bias of springs (not seen in FIG. 1) to pass under the templates. Thus, with the contraction and extension of the feed cylinder 82, the feed pawls 80 move the template/guide combinations 32 a unit distance along the guide track 22.

The return mechanism 40 comprises a pair of upstanding fluid-actuated cylinders 84, a belt conveyor 86, and another pair of upstanding fluid-actuated cylinders 88, all disposed within the enclosure 20. As will be discussed in detail subsequently, the return mechanism 40 acts to transport the successive unloaded template/guide combinations from the transfer mechanism 36 back to the first supply mechanism 28 through the interior of the enclosure 20.

The following is a more detailed discussion of the supply mechanisms 28 and 30, the positioning mechanism 34, the transfer mechanism 36, the feed mechanism 38, and the return mechanism 40, under the respective headings. The operation of the complete apparatus, and the method of this invention, will become apparent in the course of the successive descriptions of these mechanisms.

Supply Mechanisms

Of the two supply mechanisms 28 and 30, only the first 28 will be explained in detail, it being understood that the same description applies to the second 30. As shown in FIG. 1 and in more detail in FIG. 5, each shelf 90 of the rack 68 has the four parts cassettes 70 slidably mounted thereon in side-by-side relationship. Each parts cassette 70 is of relatively flat, boxlike shape and is open at least at the bottom. A plurality of upright partitions 92 divide the interior of the parts cassette 70 into several sections each accommodating a plurality or multiplicity of capacitors 50 in a stack.

Underlying the foremost interior sections of the parts cassettes 70 on each shelf 90 is a movable guide 94 slidably mounted on a fixed guide 96 for reciprocation in a direction at right angles with the parts cassettes. The movable guide 94 has formed therein four slots 98 corresponding to the respective parts cassettes 70. The fixed guide 96 has formed therethrough four slant passages 100 each in communication with one of the chutes 72. As shown in both FIGS. 1 and 2, the three movable guides 94 of the first supply mechanism 28 are jointly coupled to a fluid-actuated cylinder 102 (hereinafter referred to as the supply cylinder) bracketed at 104 to the rack 68.

Normally, or when the supply cylinder 102 is contracted, the movable guides 94 hold closed the bottoms of the foremost interior sections of the parts cassettes 70, the slots 98 in the movable guides being then displaced therefrom. Upon extension of the supply cylinder 102 the movable guides 94 slide leftward, as viewed in FIGS. 1 and 5, over the fixed guides 96 until the slots 98 in the movable guides move into alignment with the foremost interior sections of the parts cassettes 70. Thereupon one of the capacitors 50 stacked in the foremost interior section of each parts cassette 70 falls into each movable guide slot 98. The movable guide slots 98 are then out of alignment with the fixed guide passages 100, so that the capacitors do not yet fall into the chutes 72.

Upon subsequent contraction of the supply cylinder 102, the movable guides 94 slide rightward together with the capacitors 50 received in their slots 98, with the result that these capacitors fall into the slant passage 100 in the fixed guides 96 and thence into the chutes 72. During their travel through the slant passages 100 the capacitors change from a recumbent to an upstanding attitude and enter the chutes 72 in the latter attitude. Thus the capacitors fall axially through the chutes 72, until they come to a temporary standstill at the delivery control mechanisms 76 provided to the chutes.

The above process is repeated until the foremost interior sections of the parts cassettes 70 become empty of capacitors, whereupon a pusher 106 pushes the cassettes a unit distance forwardly. The parts cassettes 70 are now ready to supply the capacitors stacked in their second interior sections. Preferably, a photoelectric sensor (not shown) or the like may be employed for automatically actuating the pusher 106 each time one of the interior sections of each parts cassette becomes empty. For guiding such intermittent forward travel of the parts cassettes 70 each shelf 90 has fixedly mounted thereon, or is formed integral with, gide bars 108 interposed between the parts cassettes. Each guide bar 108 has a pair of opposed flanges or rims 110 projecting laterally from its top end for sliding engagement in guide grooves 112 formed in the opposite surfaces of the parts cassettes 70.

Figure 6:
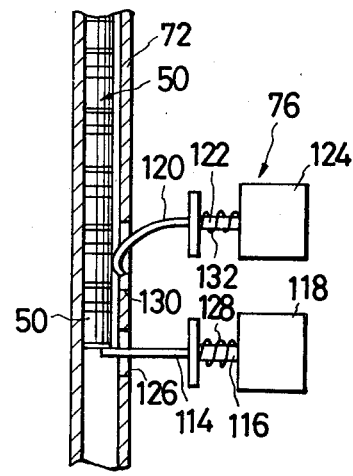
FIG. 6 is an enlarged elevational view of one of the delivery control mechanisms in the apparatus of FIG. 1, the delivery control mechanism being shown together with the chute associated therewith.

FIG. 6 is a detailed representation of each delivery control mechanism 76, shown together with one of the chutes 72 having several capacitors 50 received therein. The delivery control mechanism 76 comprises a first stop member 114 coupled to the plunger 116 of a first solenoid 118, and a second stop member 120 coupled to the plunger 122 of a second solenoid 124. The solenoids 118 and 124 are both fixedly mounted on some stationary support means (not sown).

The first stop member 114 is shown as a straight pin, movable into and out of the chute 72 through a first window 126 formed therein. When inserted into the chute 72 under the bias of a compression spring 128 sleeved upon the plunger 116, the first stop member 114 prevents the passage of the capacitors 50 therepast. The second stop member 120 is shown as a hooked leaf spring, also movable into and out of the chute 72 through a second window 130 displaced upstream from the first window 126. When urged into the chute 72 by the force of a compression spring 132 sleeved upon the plunger 122, the second stop member 120 presses against the inside surface of the chute the capacitor lying next to the one being engaged by the first stop member 114, thereby blocking the passage of that capacitor and all the succeeding ones.

In the operation of the delivery control mechanism 76, ad in the condition of FIG. 6, the first solenoid 118 may first be energized to retract the first stop member 114 against the bias of the compression spring 128. Thereupon only the foremost capacitor 50 will fall further through the chute 72, all the succeeding capacitors being blocked by the second stop member 120. The first solenoid 118 may be deenergized immediately after the foremost capacitor has gone down the chute 72, thereby permitting the first stop member 114 to return to its illustrated working position under the bias of the compression spring 128.

After the deenergization of the first solenoid 118 the second solenoid 124 may be energized to cause retraction of the second stop member 120 against the bias of the compression spring 132. Thus released from the second stop member 120, the second and all the succeeding capacitors will fall onto the first stop member 114 in its working position. The second solenoid 124 may then be deenergized to allow the second stop member 120 to spring back to its illustrated working position and hence to engage the thrid capacitor.

The repetition of the procedure set forth in the preceding two paragraphs makes it possible to deliver the capacitors 50 one by one through each chute 72 at easily controllable time intervals. Although the illustrated embodiment employs solenoids for actuation of the first 114 and second 120 stop members, it will of course be seen that the stop members could be driven by fluid-actuated cylinders, or by a cam mechanism associated with, for example, a pulse motor, or by any other suitable actuators.

A reference back to FIG. 3 will reveal that all the chutes 72 of the first supply mechanism 28 have their lower extremities implanted in the chute retainer plate 74 immovably supported by some suitable means (not shown). The chute retainer plate 74 has passages 134 formed therethrough for communicating the chutes 72 with some of the passages 44 in the guide plate 26. Thus, as each template/guide combination 32 is placed under the chute retrainer plate 74, twelve capacitors are chuted into the corresponding template depressions 42. Another twelve capacitors are supplied into the remaining template depressions 42 via the chutes 72' as the template/guide combination is subsequently placed under the chute retainer plate 74' of the second supply mechanism 30.

Figure 7:
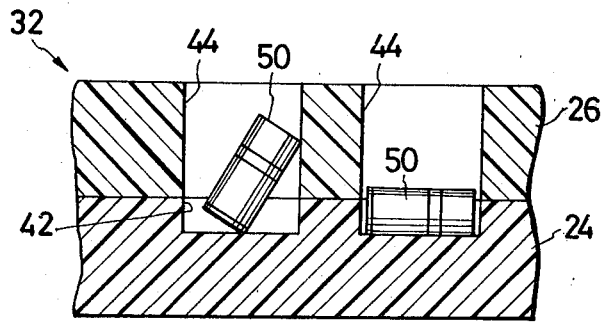
FIG. 7 is an enlarged, fragmentary, vertical sectional view of one of the template/guide combinations, the view being explanatory of the attitudes that may be assumed by the capacitors as they are chuted into the template depressions.

FIG. 7 shows, on an enlarged scale, part of the template/guide combination 32 together with the capacitors 50 received therein. Some of the capacitors may fall into the template depressions 42 in the correct recumbent attitude, like the one pictured at the right in this figure. Others may stand endwise or edgewise like the left hand one. In order to accommodate such capacitors standing endwise or edgewise the spaces formed by the template depressions 42 and guide plate passages 44 must have a height or depth in excess of the axial dimension of each capacitor 50. The attitudes of these capacitors are corrected by the positioning mechanism 34.

Positioning Mechanism

Figure 8:
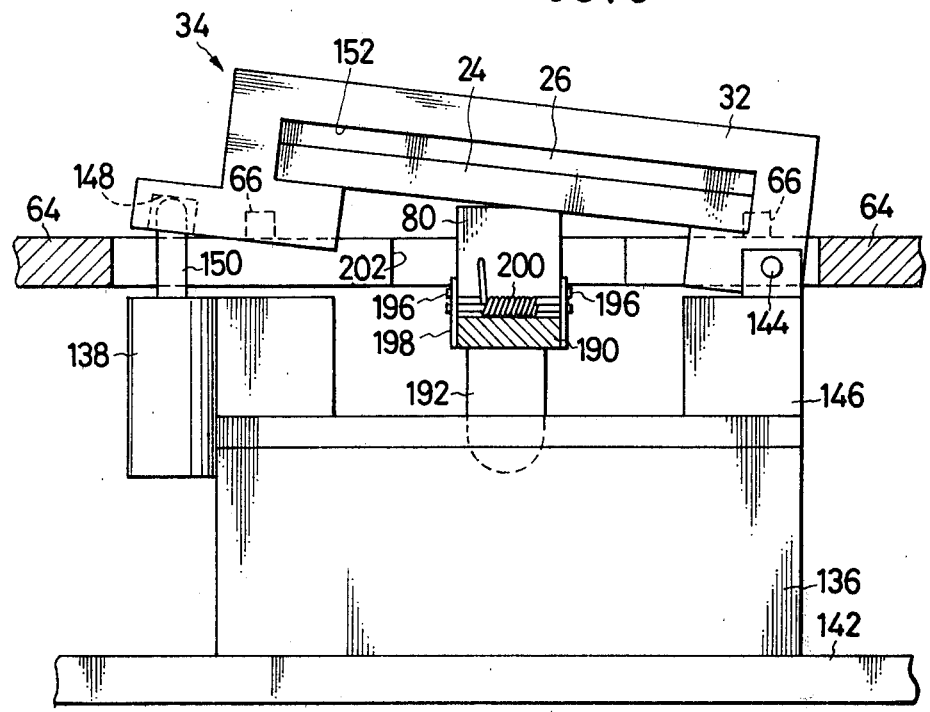
FIG. 8 is an enlarged sectional view taken along the line 8—8 of FIG. 1 and showing the positioning mechanism of the apparatus.

Loaded with the capacitors 50 as above, each template/guide combination 32 is fed from the second supply mechanism 30 to the positioning mechanism 34 by the feed mechanism 38. FIG. 8 gives the details of the positioning mechanism 34. It comprises a motor-driven vibrator 136 for vibrating the template/guide combination 32, and a fluid-actuated cylinder 138 (hereinafter referred to as the tilt cylinder) for tilting the template/guide combination in coaction with a tilting frame 140.

The vibrator 136 is mounted on a mount 142 suitably secured to the enclosure 20. The tilting frame 140 is pivotally supported along one edge thereof by a pair of trunnions 144 on a member 146 overlying the vibrator 136. The opposite, free edge of the tilting frame 140 hs formed therein a downwardly open recess 148 for receiving the tip of the piston rod 150 of the tilt cylinder 138 with working clearance. The tilting frame 140 defines a space 152 for receiving and embracing the template/guide combination 32 so as to permit its sliding motion only in the longitudinal direction of the guide track 22. It will be seen that the tilting frame 140 is downwardly open to allow the template/guide combination 32 to be fed to the next station by one of the feed pawls 80.

Fed from the second supply mechanism 30, the template/guide combination 32 is slid into the space 152 of the tilting frame 140. At this time the tilt cylinder 138 is of course held contracted to hold the tilting frame 140 in a level disposition. Then the motor-driven vibrator 136 is set into operation to impart vibration to the template/guide combination 32, with the result that those capacitors which have been standing endwise or edgewise in the template depressions 42 fall into the desired recumbent attitude. At least toward the end of the preset period during which the vibrator 136 is in operation, the tilt cylinder 138 is extended to pivot the tilting frame 140 about the trunnions 144 and so to tilt the template/guide combination 32.

Preferably, the template/guide combination 32 should be tilted about an axis more or less parallel to its diagonal. As the template/guide combination is tilted in this manner and further vibrated, the capacitors will move into close contact with the two corresponding sides of each template depression.

Figure 9:
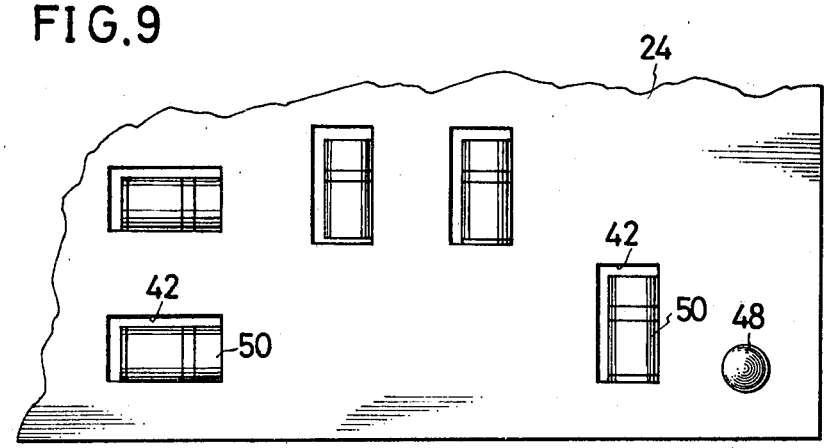
FIG. 9 is an enlarged, fragmentary, top plan view of one of the templates, shown together with the capacitors after having been positioned in the template depressions by the positioning mechanism of FIG. 8.

FIG. 9 depicts in a plan view the capacitors 50 in their readjusted positions in the template depressions 42. It will be observed that each capacitor is held against the right and lower sides, as viewed in this figure, of one of the template depressions. Such readjustment of the capacitor positions would be unnecessary if the template depressions were sized to closely receive the capacitors. In practice, however, the template depressions must be sufficiently large to allow the capacitors to fall from their upright to recumbent disposition, since it is unavoidable for some capacitors to stand endwise or edgewise as they are chuted into the template/guide combination, as has been explained in connection with FIG. 7. Thus, because of the necessary clearances with which the template depressions must receive the capacitors, these capacitors may not be mounted in the exact prescribed positions on a printed circuit board if mechanical vibrations only are applied to the template/guide combination. The simultaneous tilting and vibrating of the template/guide combination obviates this possibility, by effectively readjusting the capacitor positions in the template depressions as in FIG. 9.

The tilt cylinder 138 is contracted after the vibrator 136 is set out of operation. The template/guide combination 32, having the capacitors repositioned therein, is then fed into the transfer mechanism 36.

Transfer Mechanism

Figure 10:
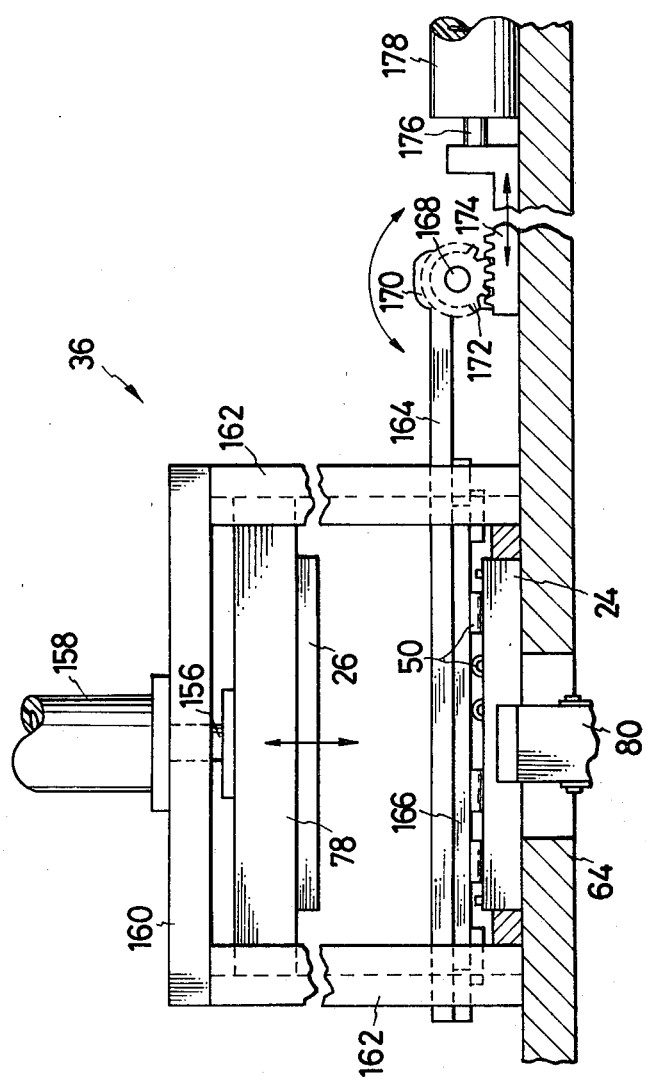
FIG. 10 is an enlarged sectional view taken along the line 10—10 of FIG. 1 and showing the transfer mechanism of the apparatus.

FIG. 10 is an illustration on an enlarged scale of the transfer mechanism 36. Included in this mechanism 36 is the lifting electromagnet assembly 78 for temporarily removing the guide plate 26 from over the template 24. Although the guide plate 26 is generally of plastics material, it is assumed to have infixed pieces of magnetizable material (not shown), so that the guide plate can be magnetically attracted to, and lifted off the template 24 by, the lifting electromagnet assembly 78. This assembly 78 is coupled to the piston rod 156 of a fluid-actuated cylinder 158 (hereinafter referred to as the lift cylinder) mounted uprightly on an elevated mount 160. The four columns or posts 162 supporting the mount 160 serve also as guides for the up-and-down motion of the lifting electromagnet assembly 78.

As the template/guide combination 32 is fed to and stopped in place on the transfer mechanism 36, the lift cylinder 158 is extended to move the lifting electromagnet assembly 78 into contact with the guide plate 26. Then the coil or coils (not shown) in the assembly 78 is energized to cause attraction of the guide plate 26 thereto. Upon subsequent contraction of the lift cylinder 158 the electromagnet assembly 78 lifts the guide plate 26 off the template 24. Now the capacitors 50 in the template depressions partly protrude upwardly from the template 24, the thickness of the template depressions being less than the diameter of the capacitors.

The transfer mechanism 36 further comprises a holder plate 164 positively but removably holding a printed circuit board 166. The holder plate 164 is fixedly mounted on a shaft 168 rotatably supported by a pair of bearings 170 (one seen). One end of the rotatable shaft 168, projecting through one of the bearings 170, has a pinion 172 mounted thereon for simultaneous rotation with the shaft. The pinion 172 is in engagement with a rack 174 coupled to the piston rod 176 of a fluid-actuated cylinder 178 (hereinafter referred to as the transfer cylinder). Upon contraction of this transfer cylinder, as shown, the holder plate 164 turns in a counterclockwise direction with the shaft 168 thereby placing the printed circuit board 166 over the template 24.

Figure 11:
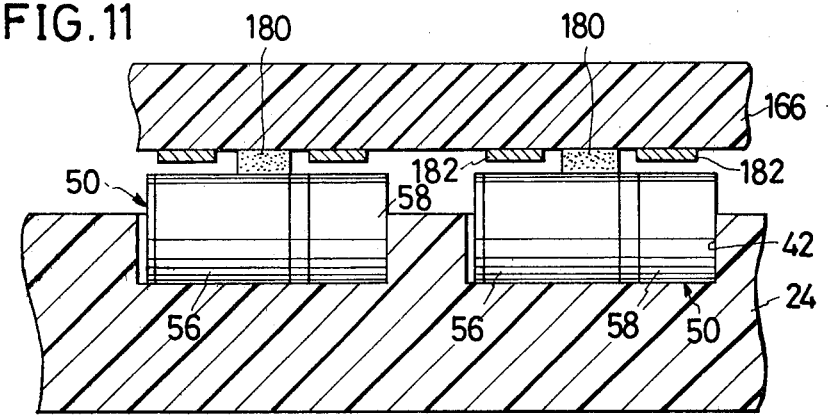
FIG. 11 is a still more enlarged, fragmentary, vertical sectional view showing a printed circuit board as placed over the template in the transfer mechanism of FIG. 10.

FIG. 11 is a greatly enlarged detail view of the printed circuit board 166 as placed over the template 24 by the transfer mechanism 36. It is understood that an adhesive has previously been applied, as by printing, to selected surface portions of the printed circuit board 166, as at 180 between two printed conductors 182 to be electrically connected to the outer electrode 56 and inner elastrode portion 58 of each capacitor 50. As the holder plate 164, actuated by the transfer cylinder 178 via the rack and pinion mechanism, forces the printed circuit board 166 against the capacitors 50 partly protruding from the template depressions 42, the capacitors will adhere to the circuit board. The template 24 has some resiliency, being molded of plastics material in this embodiment, so that all the capacitors will adhere to the circuit board in spite of possible fluctuations in their diameters as the circuit board is pressed against same.

Following the adhesion of the capacitors 50 to the printed circuit board 166, the transfer cylinder 178 is extended thereby causing the holder plate 164 to turn in a clockwise direction via the rack and pinion mechanism. The holder plate 164 carries the circuit board 166 away from over the template 24, together with the capacitors 50 adhering thereto.

Figure 12:
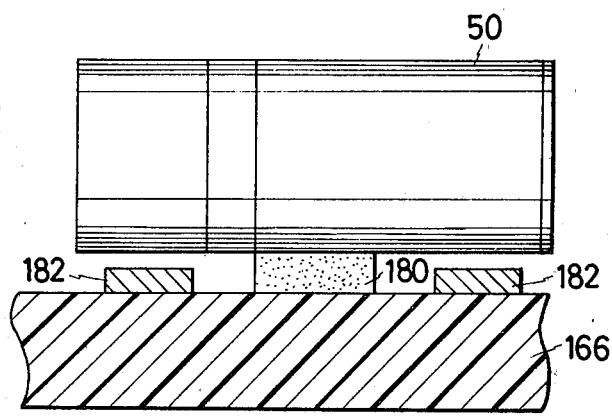
FIG. 12 is a vertical sectional view showing one of the capacitors as adhered to the printed circuit board by the transfer mechanism of FIG. 10.
Figure 13:
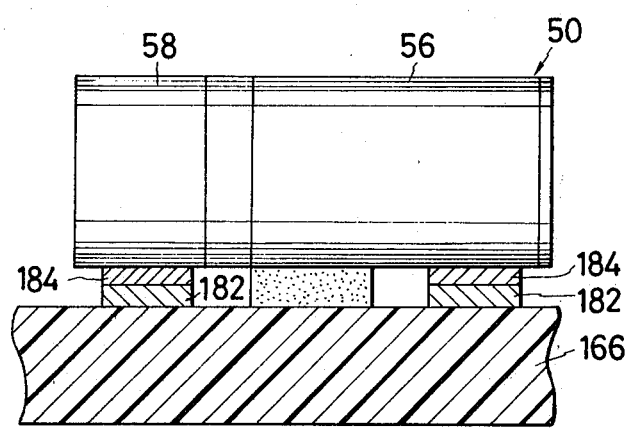
FIG. 13 is a view similar to FIG. 12 but showing the capacitor soldered to the conductive pattern on the circuit board.

FIG. 12 shows on an enlarged scale one of the capacitors 50 that have been transferred from the template 24 onto the circuit board 166 upon clockwise turn of the holder plate 164. The capacitors are now attached in position to the circuit board 166 by means of the adhesive 180. Removed from the holder plate 164, the article of FIG. 12 is then, preferably, dipped in a molten solder bath. Thus, as illustrated in FIG. 13, the outer electrode 56 and inner electrode portion 58 of each capacitor 50 are soldered at 184 to the conductors 182 and so electrically connected thereto, besides being mechanically jointed to the circuit board 166.

With reference back to FIG. 10, after the transfer of the capacitors from the template 24 to the circuit board 166, the lift cylinder 158 is extended to cause the descent of the lifting electromagnet assembly 78, thereby lowering the guide plate 26 back onto the template 24. Upon full descent of the electromagnet assembly 78 the coil or coils therein are deenergized to cause same to release the guide plate 26. If necessary the electromagnet assembly 78 may then be raised to an extent necessary to allow the superposed template 24 and guide plate 26 to be moved from under same, and to permit the next template/guide combination to be transported into position thereunder, by the feed mechanism 38.

Feed Mechanism

The construction of the feed mechanism 38 will become apparent from a study of FIG. 1 in particular. The feed cylinder 82 seen in FIG. 1 is mounted on a stationary mount 186 suitably anchored to the enclosure 20. The piston rod 188 of this feed cylinder is coupled to a horizontally extending feed bar 190 via a lug 192 depending therefrom. The feed bar 190 slidably rests on stationary supports or guides 194 and is thereby constrained to horizontal movement, in a direction parallel to the guide track 22. The feed pawls 80 are pivotally mounted on the feed bar 190 at constant longitudinal spacings.

Figure 5:
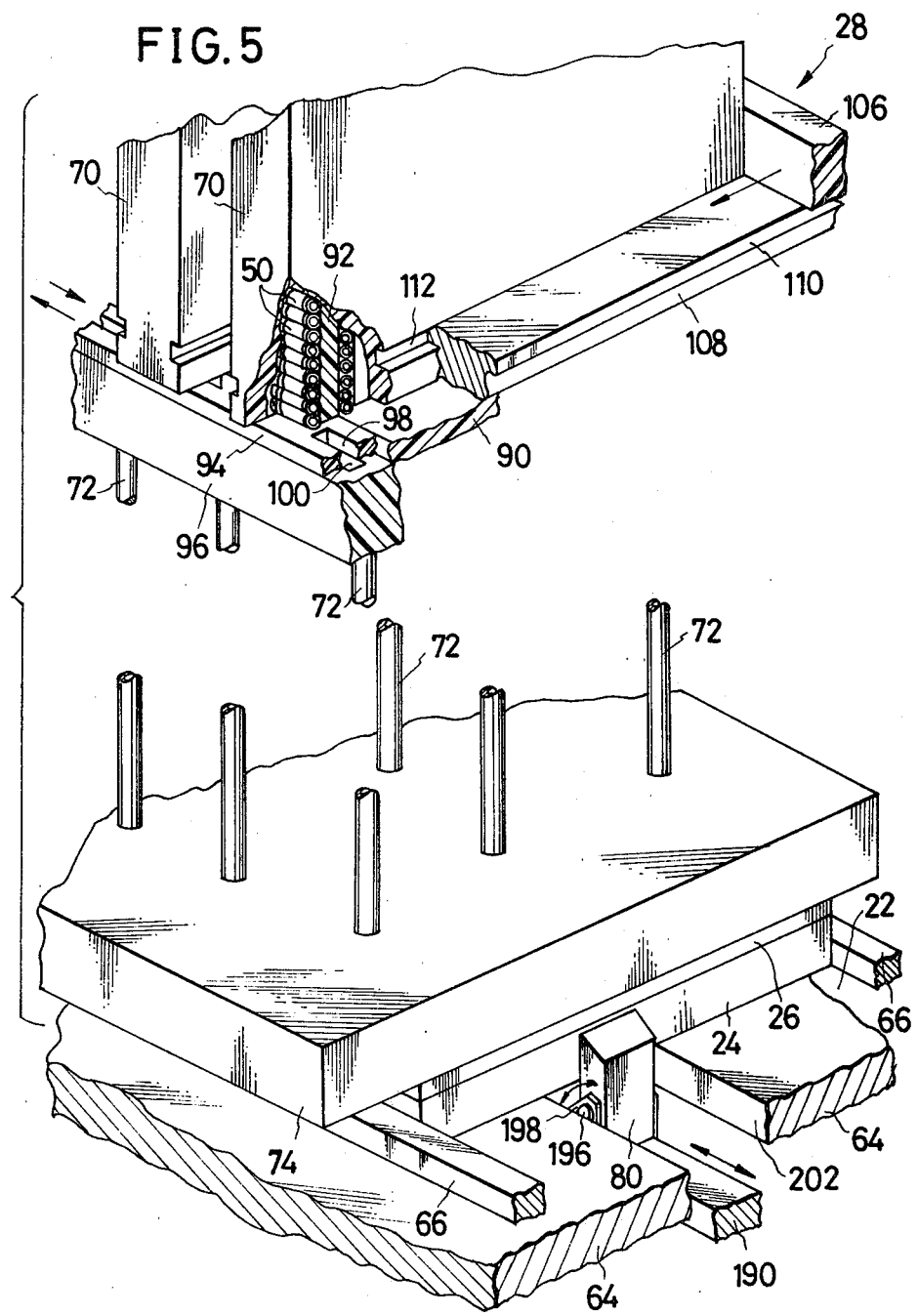
FIG. 5 is an enlarged, fragmentary perspective view, with parts broken away for clarity, showing in particular one of the supply mechanisms in the apparatus of FIG. 1.

An inspection of FIGS. 5 and 8 will reveal that each feed pawl 80 has a pair of trunnions 196 rotatably supported by a pair of bearing plates 198 fastened to the feed bar 190. Seen at 200 in FIG. 8 is a torsion spring biasing each feed pawl 80 in a clockwise direction, as viewed in FIG. 1, and normally holding the feed pawl in an upstanding attitude as its bottom end abuts against the feed bar 190. When in this upstanding attitude, the feed pawls 80 project upwardly into the guide track 22 through a slit 202 formed in the top wall 64 of the enclosure 20 and extending the full length of the guide track, for engagement with the respective templates 24 on the guide track. The feed pawls 80 are pivotable in a counterclockwise direction against the bias of the torsion springs 200.

FIG. 1 shows the feed cylinder 82 at full extension, with the five template/guide combinations 32 fed to the various stations on the guide track 22. During the progress of the above explained operations at these stations the feed cylinder 82 is contracted to cause backward movement of the feed bar 190 and of the feed pawls 80 thereon. During this return stroke the feed pawls 80 are pivoted counterclockwise against the bias of the torsion springs 200 on contact with the templates 24, to an extent necessary to pass thereunder. Upon completion of the required operations at the various stations the feed cylinder 82 is extended to feed the template/guide combinations 32 to the next stations by means of the feed pawls 80 in positive engagement therewith.

Return Mechanism

As seen also in FIG. 1, the return mechanism 40 includes the belt conveyor 86 traveling in the direction of the arrow over a pair of end rollers 204 and 206. The drive and takeup mechanisms for this belt conveyor are not illustrated because of their conventional and well known nature. At the upstream end of the belt conveyor 86 there are disposed the pair of upstanding cylinders 84 (hereinafter referred to as the descent cylinders) each having its piston rod 208 coupled to a mount 210. The descent cylinders 84 operate synchronously to lower the successive template/guide combinations 32 from the guide track 22 onto the belt conveyor 86 through an opening 212 formed in the top wall 64 of the enclosure 20.

Figure 14:
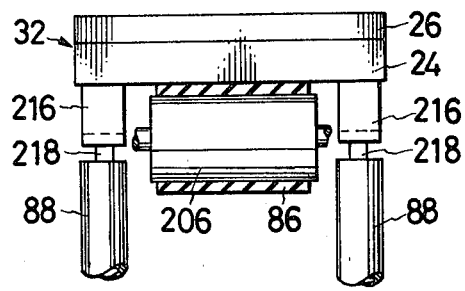
FIG. 14 is an enlarged sectional view taken along the line 14—14 of FIG. 1 and showing parts of the return mechanism.

The other pair of upstanding cylinders 88 (hereinafter referred to as the ascent cylinders) lie at the downstream end of the belt conveyor 86. These ascent cylinders also act in synchronism, lifting the successive template/guide combinations from the belt conveyor 86 to the level of the guide track 22 through an opening 214 in the enclosure top wall 64. FIG. 14 shows that the pair of ascent cylinders 88 are disposed one on each side of the belt conveyor 86, coacting to support each template/guide combination 32 with a pair of mounts 216 separately connected to their piston rods 218. The pair of descent cylinders 84 are of like arrangement.

When the feed cylinder 82 is fully extended as shown in FIG. 1, the descent cylinder pair 84 is also at full extension for allowing the empty template/guide combination 32 to be fed from the transfer mechanism 36 onto the mount pair 210. The descent cylinder pair 84 is then contracted to lower and deposit the empty template/guide combination on the belt conveyor 86. Simultaneously the ascent cylinder pair 88 is extended to raise another empty template/guide combination from the belt conveyor 86 to the level of the guide track 22. Then the feed cylinder 82 is contracted, with the feed bar 190 passing between the piston rods 218 of the ascent cylinder pair 88. Upon subsequent extension of the feed cylinder 82 the second mentioned empty template/guide combination is fed into the first supply mechanism 28 by the rearmost feed pawl 80 on the feed bar 190.

Thus, by the repetition of the foregoing procedure, capacitors or other electronic components can be efficiently mounted in position on successive printed circuit boards. It will also be appreciated that the illustrated apparatus is well calculated to lend itself to full automation.

Modifications

Figure 15:
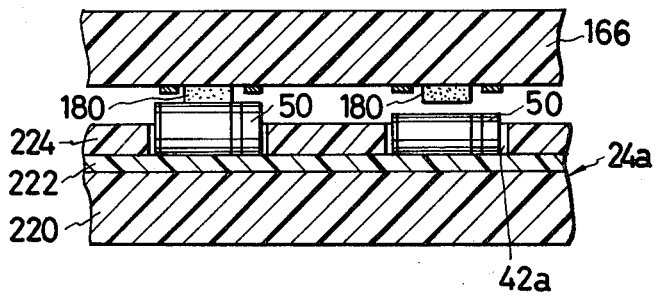
FIG. 15 is a view similar to FIG. 11 but showing a modified template.

FIG. 15 shows a modified template 24a, together with the printed circuit board 166 placed thereon at the transfer mechanism 36. The modified template 24a comprises a base plate 220, an intermediate sheet 222 of rubber or like resilient material, and a top plate 224 having openings 42a formed therethrough, which are laminated as shown. Both base plate 220 and top plate 224 can be of plastics material. The openings 42a in the top plate 224 serve as the desired depressions for accommodating the capacitors 50.

Since the resilient sheet 222 forms the bottoms of the depressions 42a in the modified template 24a, the depths of these dpressions are resiliently variable. The template depressions 42a of resiliently variable depths are preferred because the tubular ceramic capacitors or other electronic components to be handled by the method and apparatus of this invention may be of fluctuating diameters. In FIG. 15, for example, the right hand capacitor 50 is smaller in diameter than the left hand one. As the printed circuit board 66 is placed over the template 24a under pressure, however, the adhesive 180 on the circuit board will come into proper contact with both capacitors.

Figure 16:
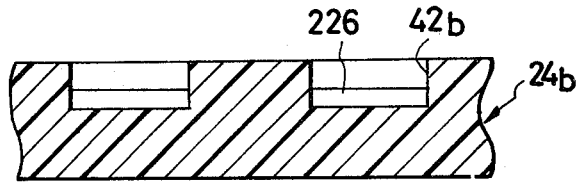
FIGS. 16 and 17 are vertical sectional views of two further modified templates.
Figure 17:
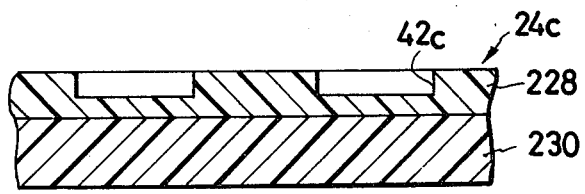

For the same purpose, in another modified template 24b shown in FIG. 16, its depressions 42b have their bottoms covered with sheets 226 of resilient material. A further modified template 24c of FIG. 17 features a top plate 228 of resilient material, which is laminated to a base plate 230. Depressions 42c of required depth are formed in the resilient top plate 228.

Figure 18:
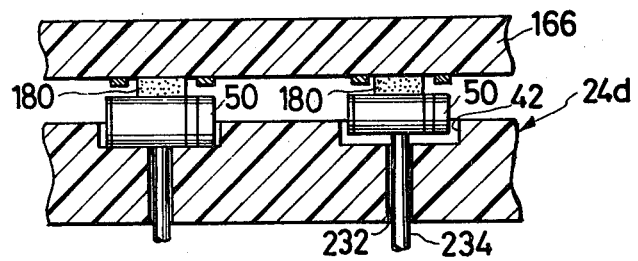
FIG. 18 is a view similar to FIG. 15 but showing a still further modified template.

FIG. 18 gives a still further modified template 24d, which differs from all the preceding examples in that a bore 232 extends downwardly from each depression 42. For the attachment of capacitors 50 of varying diameters to the printed circuit board 166, resiliently supported pins 234 or springs are inserted into and through the bores 232 to press the capacitors into contact with the adhesive 180 on the circuit board.

As an additional modification of the invention the passages 44 in the guide plates 26 may be inclined so that the capacitors may more readily assume a recumbent attitude in the template depressions as they are chuted into the guide plate passages. It is of course understood that the method and apparatus of this invention find use with metal-capped ceramic capacitors and other electronic components, in addition to tubular ceramic capacitors exemplified herein. The invention is also applicable to the manufacture of resistors or the like. A variety of other modifications, variations and adaptations will readily occur to one skilled in the art within the scope of the invention.

What is claimed is:

1. A method of simultaneously mounting a plurality of leadless electronic components in preassigned positions on a circuit board, which comprises:
    (a) providing a template having formed therein a plurality of depressions arranged in mirror-image relationship to the arrangement of the preassigned mounting positions of the electronic components on the circuit board, each depression having a depth such that the electronic component, when received therein in a correct attitude, partly protrudes therefrom;
    (b) providing a guide plate having formed therethrough a plurality of passages corresponding to the depressions in the template;
    (c) placing the guide plate on the template, with the passages in the guide plate in register with the depressions in the template, the registered passages and depressions having a total depth sufficient to thoroughly receive the electronic components regardless of their attitudes;
    (d) supplying the electronic components into the respective registered passages and depressions in the superposed guide plate and template;
    (e) correcting at least the attitudes of the electronic components in the registered passages and depressions by imparting mechanical vibrations to the superposed guide plate and template;
    (f) removing the guide plate from over the template whereby the electronic components partly protrude from the depressions in the template;
    (g) applying an adhesive to prescribed surface portions of the circuit board;
    (h) placing the circuit board on the electronic components partly protruding from the depressions in the template whereby the electronic components adhere to the circuit board; and
    (i) separating the circuit board, together with the electronic components adhering thereto, away from the template.

2. The method of claim 1, wherein each electronic component has at least two electrodes formed on its outside surface, and wherein the method further comprises the step of soldering the electrodes of the electronic components to a conductive pattern on the circuit board while the electronic components are held adhered to the circuit board.

3. The method of claim 1, wherein the positions of the electronic components in the template depressions are corrected by imparting mechanical vibrations to the superposed template and guide plate while the latter are held at an angle to the plane of the horizon.

4. Apparatus for simultaneously mounting a plurality of leadless electronic components in preassigned positions on a circuit board, the apparatus comprising:
    (a) a template having formed therein a plurality of depressions arranged in mirror-image relationship to the arrangement of the preassigned mounting positions of the electronic components on the circuit board, each depression having a depth such that the electronic component received therein, when in a correct attitude, partly protrudes therefrom;
    (b) a guide plate having formed therethrough a plurality of passages corresponding to the depressions in the template, the guide plate being adapted to be removably placed on the template, with the passages in the guide plate in register with the depressions in the template, the registered passages and depressions having a total depth sufficient to thoroughly receive the electronic components regardless of their attitudes;
    (c) a plurality of chutes for supplying the electronic components into the respective registered passages and depressions in the superposed guide plate and template;
    (d) means for controlling the supply of the electronic components through the chutes so as to permit only one electronic component to be delivered into each registered pair of passages and depressions;
    (e) means for imparting mechanical vibrations to the superposed guide plate and template in order to correct at least the attitudes of the electronic components in the registered passages and depressions in the template;
    (f) means for removing the guide plate from over the template; and
    (g) means for placing the circuit board on the electronic components partly protruding from the depressions in the template upon removal of the guide plate from thereover and then for separating the circuit board and the template from each other, the circuit board having an adhesive applied to prescribed surface portions thereof for causing adhesion thereto of the electronic components in the template depressions, whereby upon separation of the circuit board and the template from each other, the electronic components are mounted in the preassigned positions on the circuit board.

5. The apparatus of claim 4, wherein the controlling means comprises:
   (a) a first stop member movable into and out of each chute through a first window formed therein, the first stop member preventing the passage of the electronic components when moved into each chute; and
   (b) a second stop member movable into and out of each chute through a second window displaced upstream from the first window, the second stop member when moved into each chute being engageable with the electronic component lying immediately upstream of the one being arrested by the first stop member, so that when the first stop member moves out of the chute, only one electronic component is allowed to fall through the chute into one of the depressions in the template.

6. The apparatus of claim 4, further comprising a chute retainer member for holding the exit ends of the chutes in positions of registry with the passages in the guide plate.

7. The apparatus of claim 4, further comprising means for tilting the superposed template and guide plate while the latter are being subjected to mechanical vibrations.

8. The apparatus of claim 4, wherein at least the surfaces forming the bottoms of the depressions in the template are of resilient material.

9. The apparatus of claim 4, further comprising means for ensuring the adhesion of the electronic components in the template depressions to the circuit board in spite of possible variations in the sizes of the electronic components.

10. Apparatus for mounting groups of leadless electronic components in preassigned positions on successive circuit boards, the apparatus comprising:
   (a) means defining a guide track;
   (b) at least one template movable along the guide track and having formed therein a plurality of depressions arranged in mirror-image relationship to the preassigned mounting positions of the electronic components on each circuit board, each depression having a depth such that the electronic component received therein partly protrudes therefrom;
   (c) a guide plate having formed therethrough a plurality of passages corresponding to the depressions in the template, the guide plate being adapted to be removably placed on the template, with its passages in register with the template depressions, for movement therewith along the guide track;
   (d) at least one supply mechanism disposed in a first position on the guide track, the supply mechanism comprising:
      (1) means for holding a multiplicity of the electronic components;
      (2) a plurality of chutes for transporting the electronic components from the holding means into the depressions in the template via the passages in the guide plate; and
      (3) means for controlling the supply of the electronic components through the chutes so as to permit only one electronic component to travel through each chute into the corresponding one of the template depressions at one time;
   (e) a positioning mechanism disposed in a second position on the guide track for imparting mechanical vibrations to the superposed template and guide plate in order to correct the positions or attitudes of the electronic components in the template depressions;
   (f) a transfer mechanism disposed in a third position on the guide track, the transfer mechanism comprising:
      (1) means for removing the guide plate from over the template; and
      (2) means for placing a circuit board over the template and then for separating the circuit board and the template from each other, the circuit board having an adhesive applied to prescribed surface portions thereof for causing adhesion of the electronic components thereto, so that upon separation of the circuit board and the template from each other, the electronic components are transferred from the template to the circuit board and mounted in the preassigned positions on the latter;
   (g) a feed mechanism for indexing the superposed template and guide plate to the first, the second and the third positions on the guide track.

11. The apparatus of claim 10, wherein the removing means of the transfer mechanism further operates to place the guide plate back on the template following the transfer of the electronic components from the template to the circuit board, and wherein the apparatus further comprises means for returning the superposed template and guide plate from the third to the first position on the guide track.

12. The apparatus of claim 10, wherein the holding means of the supply mechanism comprises:
   (a) a rack;
   (b) a plurality of cassettes mounted in the rack and each housing a multiplicity of the electronic components; and
   (c) means for successively introducing the electronic components from each cassette into one of the chutes.

* * * * *